(12) United States Patent
Zhou

(10) Patent No.: US 9,997,634 B2
(45) Date of Patent: Jun. 12, 2018

(54) TFT BACKPLANE AND MANUFACTURING METHOD THEREOF

(71) Applicant: Shenzhen China Star Optoelectronics Technology Co., Ltd., Shenzhen (CN)

(72) Inventor: Xingyu Zhou, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 229 days.

(21) Appl. No.: 14/912,923

(22) PCT Filed: Jan. 29, 2016

(86) PCT No.: PCT/CN2016/072873
§ 371 (c)(1),
(2) Date: Feb. 19, 2016

(87) PCT Pub. No.: WO2017/092173
PCT Pub. Date: Jun. 8, 2017

(65) Prior Publication Data
US 2018/0033883 A1    Feb. 1, 2018

(30) Foreign Application Priority Data

Dec. 3, 2015 (CN) .......................... 2015 1 0882240

(51) Int. Cl.
| G02F 1/1362 | (2006.01) |
| H01L 29/786 | (2006.01) |
| H01L 21/02 | (2006.01) |
| H01L 21/28 | (2006.01) |
| H01L 23/532 | (2006.01) |

(52) U.S. Cl.
CPC ...... *H01L 29/786* (2013.01); *H01L 21/02019* (2013.01); *H01L 21/28194* (2013.01); *H01L 23/5329* (2013.01)

(58) Field of Classification Search
CPC ..................... H01L 29/41733; G02F 1/136213
See application file for complete search history.

(56) References Cited

U.S. PATENT DOCUMENTS

| 2007/0072348 A1* | 3/2007 | Chen ..................... H01L 27/124 |
| | | 438/149 |
| 2012/0175618 A1* | 7/2012 | Yamada ............ H01L 27/14663 |
| | | 257/59 |

FOREIGN PATENT DOCUMENTS

CN          103296034 A    9/2013

* cited by examiner

*Primary Examiner* — Thomas L Dickey
(74) *Attorney, Agent, or Firm* — Leong C. Lei

(57) ABSTRACT

The invention provides a TFT backplane structure and manufacturing method thereof. The TFT backplane structure uses the three-layered structure, from bottom up, dielectric layer (41), SiNx layer (42), and SiO₂ layer (43), for the gate insulating layer (4) corresponding to the location of the TFT (T), to enhance the TFT reliability; uses a double-layered gate insulating layer (4), from bottom up, the dielectric layer (41), and at least a portion of SiNx layer (42), at the location corresponding to the storage capacitor (C), or a single-layered gate insulating layer (4), i.e., the dielectric layer (4), at the location corresponding to the storage capacitor (C), the dielectric constant can be increased, the distance between the two storage capacitor electrode plates is reduced, resulting in reducing the capacitor area and improve aperture ratio on the premise of storage capacitance performance.

6 Claims, 3 Drawing Sheets

TFT BACKPLANE AND MANUFACTURING METHOD THEREOF

BACKGROUND OF THE INVENTION

1. Field of the Invention

The present invention relates to the field of display, and in particular to a thin film transistor (TFT) backplane and manufacturing method thereof.

2. The Related Arts

In the field of display technology, liquid crystal display (LCD) and organic light emitting diode (OLED) display and other flat panel display technology have gradually replaced CRT monitors, wherein the OLED provides the advantages of self-luminous, low driving voltage, high luminous efficiency, short response time, high clarity and contrast, wide viewing angle of near-180°, wide operating temperature range, enabling flexible display and large full-color display, and is recognized as the technology with most potential.

The driving types of OLED can be divided according to the passive matrix OLED (PMOLED) and active matrix OLED (AMOLED). The low temperature poly silicon (LTPS) thin film transistor (TFT) has gained attention from the industry in high resolution AMOLED technology. Compared with the amorphous silicon (a-Si), LTPS TFT has higher carrier mobility, and the device has fast response and good stability to meet the requirements of high resolution AMOLED display.

The gate insulation (GI) commonly used in known LTPS TFT backplane of AMOLED usually uses the double-layered structure of silicon dioxide/silicon nitride ($SiO_2$/SiNx), wherein the $SiO_2$ layer contacts the polysilicon active layer, and the SiNx layer contacts the gate. Compared to $SiO_2$ layer, SiNx layer provides better barrier for mobile ions, such as, sodium ions (Na+), potassium ions (K+), has a greater dielectric constant, can be made thinner than the $SiO_2$ layer under the same insulating capacity, has a higher hydrogen (H) content, and has a passivation effect on dangling bond in polysilicon. However, the SiNx layer in contact with the polysilicon active layer has a poor interface due to the stress. Hence, a $SiO_2$ layer is often deposited plus a layer of SiNx layer to form the gate insulating layer.

The thicker the SiNx layer is, the better the capabilities are as barrier to mobile ions and passivation effect. However, the reliability of the TFT elements will decrease. This is because the gate will continually inject the carrier stream into the SiNx layer, which will destroy the SiNx layer, so that the quality of the SiNx layer is deteriorated, resulting in reduced reliability of the TFT element. Therefore, under normal circumstances, SiNx layer is not thick. In addition, during fabricating the gate in the etching process, the SiNx layer is often over-etched. If a protective layer is superimposed over the SiNx layer simply to protect the SiNx layer, the thickness of the gate insulating layer corresponding to storage capacitor area is increased, resulting in performance degradation in capacitive storage. The only solution is to increase the capacitance area and sacrifice the opening ratio to ensure the capacitance storage performance.

SUMMARY OF THE INVENTION

The object of the present invention is to provide a TFT backplane structure, which is able to enhance the reliability of the TFT and also reduce the capacitor area and improve aperture ratio on the premise of ensuring the storage capacitor performance.

Another object of the present invention is to provide a manufacturing method for TFT backplane, wherein the TFT backplane fabricated by the method is able to enhance the reliability of the TFT backplane and also reduce the capacitor area and improve aperture ratio on the premise of ensuring the storage capacitor performance.

To achieve the above object, the present invention provides a TFT backplane structure, which comprises: a substrate, a buffer layer covering the substrate, a polysilicon active layer and a polysilicon electrode plate, disposed on the buffer layer with gap to separate from each other, a gate insulating layer covering the polysilicon active layer, the polysilicon electrode plate and the buffer layer, a gate disposed on the gate insulating layer above the polysilicon active layer, a metal electrode plate disposed on the gate insulating layer above the polysilicon electrode plate, an interlayer insulating layer covering the gate, the metal electrode plate and the gate insulating layer, and a source and a drain disposed on the interlayer insulating layer; the polysilicon active layer, the gate, the source and the drain constituting a TFT, and the polysilicon electrode plate and the metal electrode plate constituting a storage capacitor; the gate insulating layer having a three-layered structure at the location corresponding to the TFT, which comprising, from bottom up, a dielectric layer, a SiNx layer, and a $SiO_2$ layer; the insulating layer having a two-layered structure at the location corresponding to the storage capacitor, which comprising, from bottom up, a dielectric layer and at least a portion of SiNx layer; or the insulating layer having a single-layered structure at the location corresponding to the storage capacitor, which comprising only a dielectric layer.

Both sides of the polysilicon active layer are implanted with dopant ions to form a source contact area and a drain contact area respectively; a channel region is formed between the source contact area and the drain contact area; the source and the drain pass respectively through a first via and a second via on the interlayer insulating layer and the gate insulating layer to contact the source contact area and the drain contact area.

The TFT backplane structure further comprises a planarization layer covering the source, the drain and the interlayer insulating layer, a pixel electrode disposed on the planarization layer, a pixel definition layer disposed on the pixel electrode and the planarization layer, and a photo-resist spacer disposed on the pixel definition layer; the pixel electrode passes a third via on the planarization layer to contact the drain.

The dielectric layer is a $SiO_2$ layer.

The dielectric layer is an $Al_2O_3$, $TiO_2$, $ZrO_2$, or $HfO_2$ layer.

The resent invention further provides a manufacturing method for TFT backplane, which comprises: Step 1: provide a cleaned and pre-baked substrate; Step 2: depositing to form a buffer layer and an a-Si layer on the substrate sequentially; Step 3: using an excimer laser annealing process or solid phase crystallization process to crystallize the a-Si layer into polysilicon layer, and patterning the polysilicon layer to define a polysilicon active layer and a polysilicon electrode plate; Step 4: depositing to form a dielectric layer, a SiNx layer and a $SiO_2$ layer sequentially on the buffer layer, the polysilicon active layer and the polysilicon electrode plate to form a gate insulating layer; Step 5: using a lithography etching process to etch the gate insulating layer at a location corresponding to forming a storage capacitor to rid of the entire $SiO_2$ layer and a portion of the SiNx layer at the location, or rid of the entire $SiO_2$ layer and the entire SiNx layer at the location; Step 6: depositing and patterning a first metal layer on the gate insulating layer to form a gate and a metal electrode plate, the gate being located above the polysilicon active layer and the metal electrode plate being located above the polysilicon electrode plate; the polysilicon electrode plate and the metal electrode plate constituting a storage capacitor; Step 7: using the gate and the metal electrode plate as a masking layer to implant dopant ions on both sides of the polysilicon active layer to form a source contact area and a drain contact area respectively, a channel region being formed between the source contact area and the drain contact area; Step 8: depositing and patterning an interlayer insulating layer on the gate insulating layer, the gate and the metal electrode plate to form a first via and a second via exposing a portion of the surface of the source contact area and the drain contact area; and Step 9: depositing and patterning a second metal layer on the interlayer insulating layer to form a source and a drain, the source and the drain contacting the source contact area and the drain contact area respectively through the first via and the second via; the polysilicon active layer, the gate, the source and the drain constituting a TFT.

The manufacturing method for TFT backplane further comprises Step 10: forming a planarization layer, a pixel electrode, a pixel definition layer and a photo-resist spacer from bottom up sequentially on the interlayer insulating layer, the source and the drain; the pixel electrode contacts the drain through a third via on the planarization layer.

The dielectric layer in Step 4 is a $SiO_2$ layer.

The dielectric layer in Step 4 is an $Al_2O_3$, $TiO_2$, $ZrO_2$, or $HfO_2$ layer.

The dopant ions implanted in Step 7 are phosphorus ions or boron ions.

The present invention further provides a manufacturing method for TFT backplane, which comprises: Step 1: provide a cleaned and pre-baked substrate; Step 2: depositing to form a buffer layer and an a-Si layer on the substrate sequentially; Step 3: using an excimer laser annealing process or solid phase crystallization process to crystallize the a-Si layer into polysilicon layer, and patterning the polysilicon layer to define a polysilicon active layer and a polysilicon electrode plate; Step 4: depositing to form a dielectric layer, a SiNx layer and a $SiO_2$ layer sequentially on the buffer layer, the polysilicon active layer and the polysilicon electrode plate to form a gate insulating layer; Step 5: using a lithography etching process to etch the gate insulating layer at a location corresponding to forming a storage capacitor to rid of the entire $SiO_2$ layer and a portion of the SiNx layer at the location, or rid of the entire $SiO_2$ layer and the entire SiNx layer at the location; Step 6: depositing and patterning a first metal layer on the gate insulating layer to form a gate and a metal electrode plate, the gate being located above the polysilicon active layer and the metal electrode plate being located above the polysilicon electrode plate; the polysilicon electrode plate and the metal electrode plate constituting a storage capacitor; Step 7: using the gate and the metal electrode plate as a masking layer to implant dopant ions on both sides of the polysilicon active layer to form a source contact area and a drain contact area respectively, a channel region being formed between the source contact area and the drain contact area; Step 8: depositing and patterning an interlayer insulating layer on the gate insulating layer, the gate and the metal electrode plate to form a first via and a second via exposing a portion of the surface of the source contact area and the drain contact area; Step 9: depositing and patterning a second metal layer on the interlayer insulating layer to form a source and a drain, the source and the drain contacting the source contact area and the drain contact area respectively through the first via and the second via; the polysilicon active layer, the gate, the source and the drain constituting a TFT; and Step 10: forming a planarization layer, a pixel electrode, a pixel definition layer and a photo-resist spacer from bottom up sequentially on the interlayer insulating layer, the source and the drain; the pixel electrode contacts the drain through a third via on the planarization layer; wherein the dielectric layer in Step 4 is a $SiO_2$ layer; wherein the dopant ions implanted in Step 7 are phosphorus ions or boron ions.

Compared to the known techniques, the present invention provides the following advantages: the present invention provides a TFT backplane structure and a manufacturing method thereof. By using the three-layered structure, from bottom up, dielectric layer, SiNx layer, and $SiO_2$ layer, for the gate insulating layer corresponding to the location of the TFT, the $SiO_2$ layer prevents the gate from injecting carriers to the SiNx layer to avoid damage. The $SiO_2$ layer may also prevent an excessive etching on the SiNx layer, which enhances the TFT reliability. By using a double-layered gate insulating layer, from bottom up, the dielectric layer, and at least a portion of SiNx layer, at the location corresponding to the storage capacitor, or a single-layered gate insulating layer, i.e., the dielectric layer, at the location corresponding to the storage capacitor, the dielectric constant can be increased, the distance between the two storage capacitor electrode plates is reduced, resulting in reducing the capacitor area and improve aperture ratio on the premise of storage capacitance performance. The manufacturing method of the present invention provides uses a lithography etching process to etch the gate insulating layer at the location corresponding to forming a storage capacitor to rid of the entire $SiO_2$ layer and a portion of the SiNx layer at the location, or rid of the entire $SiO_2$ layer and the entire SiNx layer at the location, so that the gate insulating layer TFT backplane has a three-layered structure at the location corresponding to the TFT and a two-layered or single-layered structure at the location corresponding to the storage capacitor. As such, the TFT backplane is more reliable, and on the premise of storage capacitance performance, reducing the capacitor area and improve aperture ratio.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
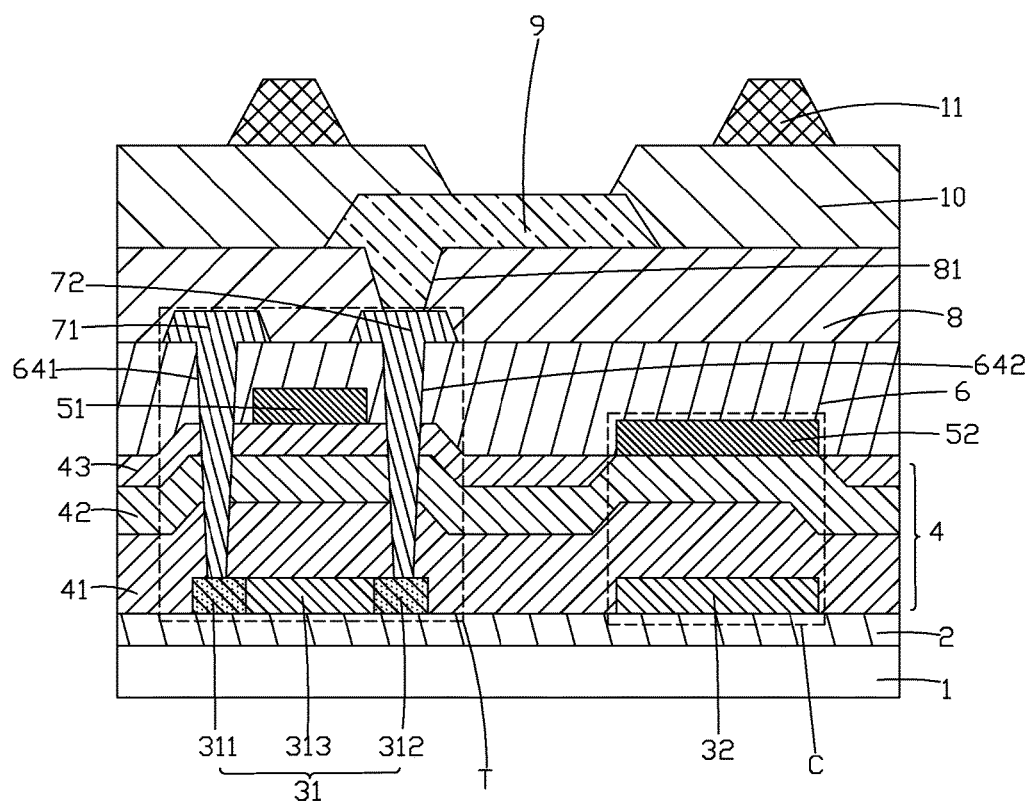
FIG. 1 is a cross-sectional view showing the TFT backplane structure provided by a first embodiment of the present invention.

Refer to FIG. 1 for the first embodiment of the TFT backplane structure provided by the present invention, which comprises: a substrate 1, a buffer layer 2 covering the substrate 1, a polysilicon active layer 31 and a polysilicon electrode plate 32, disposed on the buffer layer 2 with gap to separate from each other, a gate insulating layer 4 covering the polysilicon active layer 31, the polysilicon electrode plate 32 and the buffer layer 2, a gate 51 disposed on the gate insulating layer 4 above the polysilicon active layer 31, a metal electrode plate 52 disposed on the gate insulating layer 4 above the polysilicon electrode plate 32, an interlayer insulating layer 6 covering the gate 51, the metal electrode plate 52 and the gate insulating layer 4, and a source 71 and a drain 72 disposed on the interlayer insulating layer 6, a planarization layer 8 covering the source 71, the drain 72 and the interlayer insulating layer 6, a pixel electrode 9 disposed on the planarization layer 8, a pixel definition layer 10 disposed on the pixel electrode 8 and the planarization layer 9, and a photo-resist spacer 11 disposed on the pixel definition layer 10.

Both sides of the polysilicon active layer 31 are implanted with dopant ions to form a source contact area 311 and a drain contact area 312 respectively; a channel region 313 is formed between the source contact area 311 and the drain contact area 312. The source 71 and the drain 72 pass respectively through a first via 641 and a second via 642 on the interlayer insulating layer 6 and the gate insulating layer 4 to contact the source contact area 311 and the drain contact area 312. The pixel electrode 9 passes a third via 81 on the planarization layer 8 to contact the drain 72.

The polysilicon active layer 31, the gate 51, the source 71 and the drain 72 constitutes a TFT, and the polysilicon electrode plate 32 and the metal electrode plate 52 constitutes a storage capacitor C.

It should be noted that, in the first embodiment, the gate insulating layer 4 has a three-layered structure at the location corresponding to the TFT, which comprising, from bottom up, a dielectric layer 41, a SiNx layer 42, and a $SiO_2$ layer 43; the insulating layer has a two-layered structure at the location corresponding to the storage capacitor C, which comprising, from bottom up, a dielectric layer 41 and at least a portion of SiNx layer 42. Moreover, the dielectric layer 41 is a $SiO_2$ layer. The advantage of this structure: corresponding to the TFT location, the $SiO_2$ layer 43 of the topmost of gate insulating layer 4 can effectively prevent the gate 51 from injecting carriers to the SiNx layer 42 to avoid the effect of the carriers to ensure the quality of the gate insulating layer 4; also, the $SiO_2$ layer 43 can prevent the SiNx layer 42 from excessive etching during forming the gate 51 so as to improve TFT reliability; the thickness of the gate insulating layer 4 at the location corresponding to the storage capacitor C is reduced, and the $SiO_2$ content is decreased, the electric constant increases, the distance between the polysilicon electrode plate 32 and the metal electrode plate 52 of the storage capacitor C is reduced, so that on the premise of ensuring the storage capacitance performance (mainly the capacitance quantity), the area of the capacitor C is reduced and the aperture ratio is improved.

Specifically, the substrate 1 is preferably a glass substrate.

The thickness of the buffer layer 2 is 500-2000 Å, and may be a single SiNx layer, single-layer SiOx layer, or a SiNx and SiOx stacked layer.

The thickness of the polysilicon active layer 31 and polysilicon electrode plate 32 is both 500-000 Å.

The thickness of the $SiO_2$ layer serving as the dielectric layer 41 is 500-1000 Å, the thickness of the SiNx layer 42 is 200-500 Å, and the thickness of the $SiO_2$ layer 43 is 500-1000 Å.

The gate electrode 51 and the metal plate 52 are both of molybdenum/aluminum/molybdenum (Mo/Al/Mo) stacked structure, or molybdenum/aluminum (Mo/Al) stacked structure, the thickness of both is 1500-2000 Å.

The dopant ions implanted on both sides of the polysilicon active layer 31 are phosphorus ions (P+), or boron ions (B+), and correspondingly, the TFT T is an N-type TFT, or a P-type TFT.

The thickness of the interlayer insulating layer 6 is 2000-6000 Å, and may be a single SiNx layer, single-layer SiOx layer, or a SiNx and SiOx stacked layer.

The source 71 and the drain 72 are of Mo/Al/Mo stacked structure, or Mo/Al stacked structure, and the thickness of both is 1500-2000 Å.

The material of the pixel electrode 9 is indium tin oxide (ITO).

Figure 2:
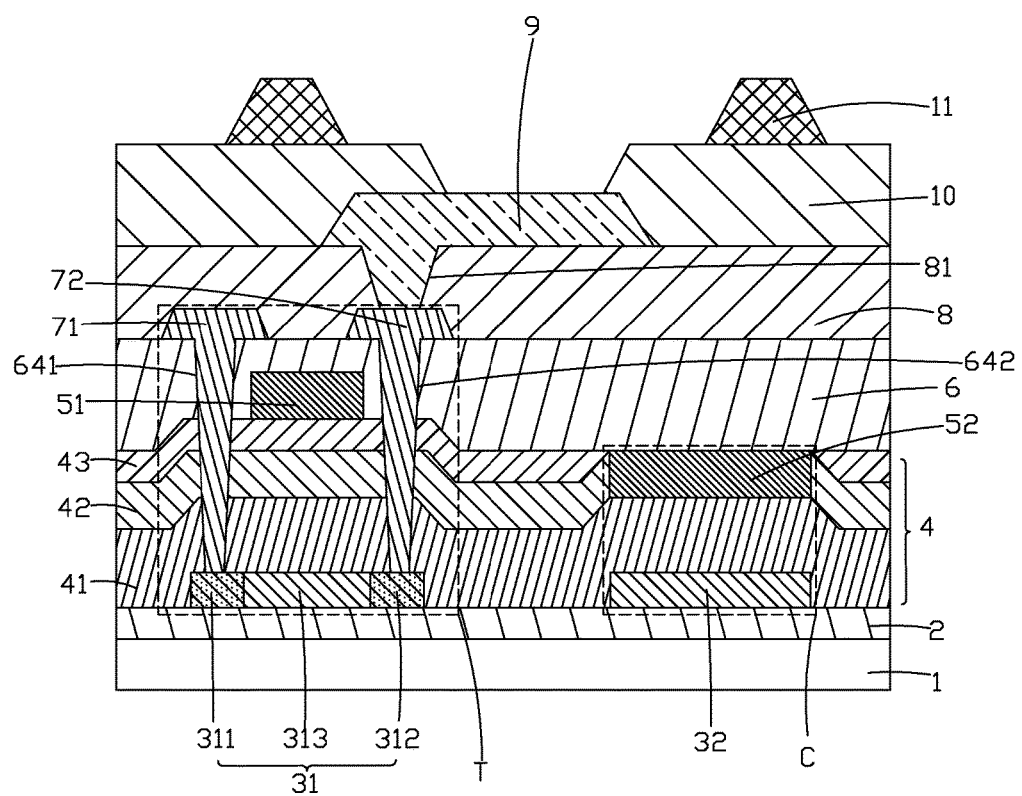
FIG. 2 is a cross-sectional view showing the TFT backplane structure provided by a second embodiment of the present invention.

Refer to FIG. 2 for the second embodiment of the TFT backplane of the present invention. The second embodiment differs from the first embodiment in that: the gate insulating layer 4 has a three-layered structure at the location corresponding to the TFT, which comprising, from bottom up, a dielectric layer 41, a SiNx layer 42, and a $SiO_2$ layer 43; the insulating layer has a single-layered structure at the location corresponding to the storage capacitor C, which comprising only a dielectric layer 41. Moreover, the dielectric layer 41 is an $Al_2O_3$, $TiO_2$, $ZrO_2$, or $HfO_2$ layer, which has a high dielectric constant. The second embodiment uses a high dielectric constant layer to replace the $SiO_2$ as the dielectric layer 41, which can further reduce the thickness of the gate insulating layer 4 at the location corresponding to the storage capacitor C. In addition, by only keeping the dielectric layer 41 with a high constant, the area of capacitor C is reduced and the aperture ratio is improved.

Figure 3:
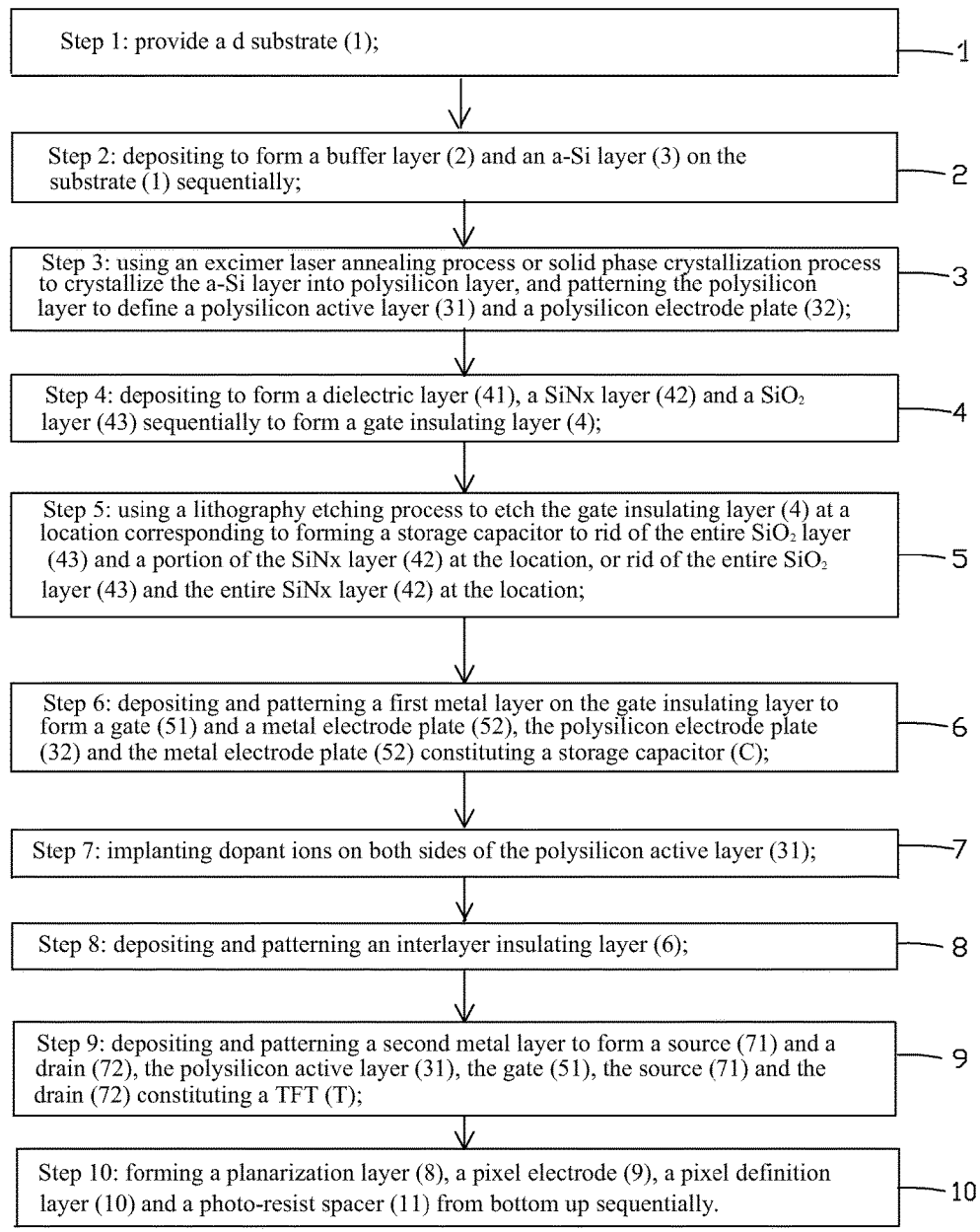
FIG. 3 is a schematic view showing the flowchart of the manufacturing method of TFT backplane provided by an embodiment of the present invention.

Refer to FIG. 3, in combination with FIGS. 1, 2. The present invention further provides a manufacturing method for TFT backplane, which comprises:

Step 1: provide a cleaned and pre-baked substrate 1.

The substrate 1 is preferably a glass substrate.

Step 2: depositing to form a buffer layer 2 and an a-Si layer on the substrate 1 sequentially.

The thickness of the buffer layer 2 is 500-2000 Å, and may be a single SiNx layer, single-layer SiOx layer, or a SiNx and SiOx stacked layer.

The thickness of the polysilicon active layer 31 and polysilicon electrode plate 32 is both 500-000 Å.

Step 3: using an excimer laser annealing (ELA) process or solid phase crystallization (SPC) process to crystallize the a-Si layer into polysilicon layer, and patterning the polysilicon layer to define a polysilicon active layer 31 and a polysilicon electrode plate 32.

Step 4: depositing to form a dielectric layer 41, a SiNx layer 42 and a $SiO_2$ 43 layer sequentially on the buffer layer 2, the polysilicon active layer 31 and the polysilicon electrode plate 32 to form a gate insulating layer 4.

Specifically, the thickness of the $SiO_2$ layer serving as the dielectric layer 41 is 500-1000 Å, the thickness of the SiNx layer 42 is 200-500 Å, and the thickness of the $SiO_2$ layer 43 is 500-1000 Å.

Optionally, as shown in FIG. 1, the dielectric layer 41 is a $SiO_2$ layer.

Optionally, as shown in FIG. 2, the dielectric layer 41 is an $Al_2O_3$, $TiO_2$, $ZrO_2$, or $HfO_2$ layer, which has a high dielectric constant.

Step 5: using a lithography etching process to etch the gate insulating layer 4 at a location corresponding to forming a storage capacitor to rid of the entire SiO₂ layer 43 and a portion of the SiNx layer 42 at the location as shown in FIG. 1, or rid of the entire SiO₂ layer 43 and the entire SiNx layer 42 at the location as shown in FIG. 2.

The thickness of the gate insulating layer 4 at the location corresponding to the storage capacitor is reduced by Step 5.

Step 6: depositing and patterning a first metal layer on the gate insulating layer 4 to form a gate 51 and a metal electrode plate 52, the gate 51 being located above the polysilicon active layer 31 and the metal electrode plate 52 being located above the polysilicon electrode plate 32.

The polysilicon electrode plate 32 and the metal electrode plate 52 constitute a storage capacitor C.

Specifically, the gate electrode 51 and the metal plate 52 are both of Mo/Al/Mo stacked structure, or Mo/Al stacked structure, the thickness of both is 1500-2000 Å.

Step 7: using the gate 51 and the metal electrode plate 52 s a masking layer to implant dopant ions on both sides of the polysilicon active layer 31 to form a source contact area 311 and a drain contact area 312 respectively, a channel region 313 being formed between the source contact area 311 and the drain contact area 312.

The dopant ions implanted on both sides of the polysilicon active layer 31 are phosphorus ions (P+) from a $PH_3$ gas source, or boron ions (B+) from a $B_2H_6$ gas source.

Step 8: depositing and patterning an interlayer insulating layer 6 on the gate insulating layer 4, the gate 51 and the metal electrode plate 52 to form a first via 641 and a second via 642 exposing a portion of the surface of the source contact area 311 and the drain contact area 312.

Specifically, the thickness of the interlayer insulating layer 6 is 2000-6000 Å, and may be a single SiNx layer, single-layer SiOx layer, or a SiNx and SiOx stacked layer.

Step 9: depositing and patterning a second metal layer on the interlayer insulating layer 6 to form a source 71 and a drain 72, the source 71 and the drain 72 contacting the source contact area 311 and the drain contact area 312 respectively through the first via 641 and the second via 642.

The polysilicon active layer 31, the gate 51, the source 71 and the drain 72 constitute a TFT. If the dopant ions implanted in Step 7 are P+ ions, the TFT is N-type TFT. If the dopant ions implanted in Step 7 are B+ ions, the TFT is P-type TFT.

The second metal layer is of Mo/Al/Mo stacked structure, or Mo/Al stacked structure, and the thickness is 1500-2000 Å.

Step 10: forming a planarization layer 8, a pixel electrode 9, a pixel definition layer 10 and a photo-resist spacer 11 from bottom up sequentially on the interlayer insulating layer 6, the source 71 and the drain 72.

Specifically, the pixel electrode 9 contacts the drain 72 through a third via 81 on the planarization layer 8. The pixel electrode 9 is made of ITO.

The TFT backplane manufacture by the above method is shown in FIG. 1 or FIG. 2. The gate insulating layer 4 has a three-layered structure at the location corresponding to the TFT, which comprising, from bottom up, a dielectric layer 41, a SiNx layer 42, and a SiO₂ layer 43; the SiO₂ layer 43 of the topmost of gate insulating layer 4 can effectively prevent the gate 51 from injecting carriers to the SiNx layer 42 to avoid the effect of the carriers to ensure the quality of the gate insulating layer 4; also, the SiO₂ layer 43 can prevent the SiNx layer 42 from excessive etching during forming the gate 51 so as to improve TFT reliability. The gate insulating layer has a two-layered structure at the location corresponding to the storage capacitor C, which comprising, from bottom up, a SiO₂ layer serving as the dielectric layer 41 and at least a portion of SiNx layer 42, or the gate insulating layer 4 has a singleo-layered structure at the location corresponding to the storage capacitor C comprising only a dielectric layer 41 of an $Al_2O_3$, $TiO_2$, $ZrO_2$, or $HfO_2$ layer, which has a high dielectric constant so that the thickness of the gate insulating layer 4 at the location corresponding to the storage capacitor C is reduced, and the SiO₂ content is decreased, the electric constant increases, the distance between the polysilicon electrode plate 32 and the metal electrode plate 52 of the storage capacitor C is reduced, so that on the premise of ensuring the storage capacitance performance (mainly the capacitance quantity), the area of the capacitor C is reduced and the aperture ratio is improved.

In summary, the present invention provides a TFT backplane structure and manufacturing method thereof. By using the three-layered structure, from bottom up, dielectric layer, SiNx layer, and SiO₂ layer, for the gate insulating layer corresponding to the location of the TFT, the SiO₂ layer prevents the gate from injecting carriers to the SiNx layer to avoid damage. The SiO₂ layer may also prevent an excessive etching on the SiNx layer, which enhances the TFT reliability. By using a double-layered gate insulating layer, from bottom up, the dielectric layer, and at least a portion of SiNx layer, at the location corresponding to the storage capacitor, or a single-layered gate insulating layer, i.e., the dielectric layer, at the location corresponding to the storage capacitor, the dielectric constant can be increased, the distance between the two storage capacitor electrode plates is reduced, resulting in reducing the capacitor area and improve aperture ratio on the premise of storage capacitance performance. The manufacturing method of the present invention provides uses a lithography etching process to etch the gate insulating layer at the location corresponding to forming a storage capacitor to rid of the entire SiO₂ layer and a portion of the SiNx layer at the location, or rid of the entire SiO₂ layer and the entire SiNx layer at the location, so that the gate insulating layer TFT backplane has a three-layered structure at the location corresponding to the TFT and a two-layered or single-layered structure at the location corresponding to the storage capacitor. As such, the TFT backplane is more reliable, and on the premise of storage capacitance performance, reducing the capacitor area and improve aperture ratio.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . ." does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A manufacturing method for thin film transistor (TFT) backplane, which comprises:

Step 1: providing a cleaned and pre-baked substrate;

Step 2: depositing to form a buffer layer and an a-Si layer on the substrate sequentially;

Step 3: using an excimer laser annealing process or solid phase crystallization process to crystallize the a-Si layer into polysilicon layer, and patterning the polysilicon layer to define a polysilicon active layer and a polysilicon electrode plate;

Step 4: depositing to form a dielectric layer, a SiNx layer and a $SiO_2$ layer sequentially on the buffer layer, the polysilicon active layer and the polysilicon electrode plate to form a gate insulating layer;

Step 5: using a lithography etching process to etch the gate insulating layer at a location corresponding to forming a storage capacitor to rid of the entire $SiO_2$ layer and a portion of the SiNx layer at the location, or rid of the entire $SiO_2$ layer and the entire SiNx layer at the location;

Step 6: depositing and patterning a first metal layer on the gate insulating layer to form a gate and a metal electrode plate, the gate being located above the polysilicon active layer and the metal electrode plate being located above the polysilicon electrode plate;

the polysilicon electrode plate and the metal electrode plate constituting a storage capacitor Step 7: using the gate and the metal electrode plate as a masking layer to implant dopant ions on both sides of the polysilicon active layer to form a source contact area and a drain contact area respectively, a channel region being formed between the source contact area and the drain contact area;

Step 8: depositing and patterning an interlayer insulating layer on the gate insulating layer, the gate and the metal electrode plate to form a first via and a second via exposing a portion of the surface of the source contact area and the drain contact area; and Step 9: depositing and patterning a second metal layer on the interlayer insulating layer to form a source and a drain, the source and the drain contacting the source contact area and the drain contact area respectively through the first via and the second via;

the polysilicon active layer, the gate, the source and the drain constituting a TFT.

2. The manufacturing method as claimed in claim 1, further comprising Step 10: forming a planarization layer, a pixel electrode, a pixel definition layer and a photo-resist spacer from bottom up sequentially on the interlayer insulating layer, the source and the drain;

wherein the pixel electrode contacts the drain through a third via on the planarization layer.

3. The manufacturing method as claimed in claim 1, wherein the dielectric layer in Step 4 is a $SiO_2$ layer.

4. The manufacturing method as claimed in claim 1, wherein the dielectric layer in Step 4 is an $Al_2O_3$, $TiO_2$, $ZrO_2$, or $HfO_2$ layer.

5. The manufacturing method as claimed in claim 1, wherein the dopant ions implanted in Step 7 are phosphorus ions or boron ions.

6. A manufacturing method for thin film transistor (TFT) backplane, which comprises:

Step 1: providing a cleaned and pre-baked substrate;

Step 2: depositing to form a buffer layer and an a-Si layer on the substrate sequentially;

Step 3: using an excimer laser annealing process or solid phase crystallization process to crystallize the a-Si layer into polysilicon layer, and patterning the polysilicon layer to define a polysilicon active layer and a polysilicon electrode plate;

Step 4: depositing to form a dielectric layer, a SiNx layer and a $SiO_2$ layer sequentially on the buffer layer, the polysilicon active layer and the polysilicon electrode plate to form a gate insulating layer;

Step 5: using a lithography etching process to etch the gate insulating layer at a location corresponding to forming a storage capacitor to rid of the entire $SiO_2$ layer and a portion of the SiNx layer at the location, or rid of the entire $SiO_2$ layer and the entire SiNx layer at the location;

Step 6: depositing and patterning a first metal layer on the gate insulating layer to form a gate and a metal electrode plate, the gate being located above the polysilicon active layer and the metal electrode plate being located above the polysilicon electrode plate;

the polysilicon electrode plate and the metal electrode plate constituting a storage capacitor;

Step 7: using the gate and the metal electrode plate as a masking layer to implant dopant ions on both sides of the polysilicon active layer to form a source contact area and a drain contact area respectively, a channel region being formed between the source contact area and the drain contact area;

Step 8: depositing and patterning an interlayer insulating layer on the gate insulating layer, the gate and the metal electrode plate to form a first via and a second via exposing a portion of the surface of the source contact area and the drain contact area; and Step 9: depositing and patterning a second metal layer on the interlayer insulating layer to form a source and a drain, the source and the drain contacting the source contact area and the drain contact area respectively through the first via and the second via;

the polysilicon active layer, the gate, the source and the drain constituting a TFT;

Step 10: forming a planarization layer, a pixel electrode, a pixel definition layer and a photo-resist spacer from bottom up sequentially on the interlayer insulating layer, the source and the drain;

wherein the pixel electrode contacts the drain through a third via on the planarization layer;

wherein the dielectric layer in Step 4 is a $SiO_2$ layer;

wherein the dopant ions implanted in Step 7 are phosphorus ions or boron ions.

* * * * *